United States Patent
Choi et al.

(10) Patent No.: US 8,817,561 B2
(45) Date of Patent: Aug. 26, 2014

(54) METHOD FOR ESTIMATING CHANNEL CHARACTERISTICS OF NONVOLATILE MEMORY DEVICE

(71) Applicants: SK hynix Inc., Icheon-si (KR); Korea Advanced Institute of Science and Technology, Daejeon (KR)

(72) Inventors: Seok Hwan Choi, Icheon-si (KR); Joong Seob Yang, Icheon-si (KR); Seung Ho Chang, Icheon-si (KR); Sang Sik Kim, Icheon-si (KR); Sang Chul Lee, Icheon-si (KR); Ho Yeon Lee, Icheon-si (KR); Jaekyun Moon, Daejeon (KR); Jaehyeong No, Daejeon (KR)

(73) Assignees: SK Hynix Inc., Gyeonggi-do (KR); Korea Advanced Institute of Science and Technology, Daejeon (KR)

( * ) Notice: Subject to any disclaimer, the term of this patent is extended or adjusted under 35 U.S.C. 154(b) by 15 days.

(21) Appl. No.: 13/767,598

(22) Filed: Feb. 14, 2013

(65) Prior Publication Data

US 2014/0010031 A1 Jan. 9, 2014

(30) Foreign Application Priority Data

Jul. 9, 2012 (KR) .................. 10-2012-0074470

(51) Int. Cl.
*G11C 29/04* (2006.01)
(52) U.S. Cl.
USPC .................. 365/201; 365/185.03
(58) Field of Classification Search
USPC ............................ 365/201, 185.03
See application file for complete search history.

(56) References Cited

U.S. PATENT DOCUMENTS

2007/0195616 A1* 8/2007 Fallah et al. .................. 365/194
2007/0211535 A1* 9/2007 Kim ......................... 365/185.21

FOREIGN PATENT DOCUMENTS

| KR | 1020060134011 A | 12/2006 |
| KR | 1020080062709 A | 7/2008 |
| KR | 1020090002483 A | 1/2009 |
| KR | 1020100091544 A | 8/2010 |
| KR | 1020110103165 A | 9/2011 |

OTHER PUBLICATIONS

Jaekyun Moon et al., Statistical Analysis of Flash Memory Read Data, IEEE Globecom, 2011, Houston, Texas, USA.
Yuan-Hao Chang et al., Endurance Enhancement of Flash-Memory Storage Systems: An Efficient Static Wear Leveling Design, Design Automation Conference, 2007, 212-217, San Diego, California, USA.

* cited by examiner

*Primary Examiner* — Michael Tran
(74) *Attorney, Agent, or Firm* — William Park & Associates Patent Ltd.

(57) ABSTRACT

A method for estimating channel characteristics of a nonvolatile memory device including a plurality of memory cells includes the steps of: calculating first threshold voltage distributions of the memory cells programmed according to input data, based on the input data and a physical structure of the memory cells; calculating second threshold voltage distributions of the memory cells, based on output data and the physical structure of the memory cells; and analyzing the relation between the first and second threshold voltage distributions, using a mask.

20 Claims, 7 Drawing Sheets

| Input Data (or Output Data) | PG0 (LSB) | | | PG1 (MSB) | | | PG2 (LSB) | | | PG3 (MSB) | | | ... | PG2n-1 (LSB) | | | PG2n (MSB) | | |
|---|---|---|---|---|---|---|---|---|---|---|---|---|---|---|---|---|---|---|---|
| WL# | WL0 | | | | | | WL1 | | | | | | ... | WLn | | | | | |
| BL# | BL0 | BL1 | ... | BLm | BL0 | BL1 | ... | BLm | | | | | ... | BL0 | BL1 | ... | BLm | | | |
| Memory Cell# | C00 | C01 | ... | C0m | C10 | C11 | ... | C1m | | | | | ... | Cn0 | Cn1 | ... | Cnm | | | |
| Cell State | P0 | P1 | ... | P1 | P2 | P0 | ... | E | | | | | ... | P1 | E | ... | E | | | |

| INDEX | B | L | R | Q | Vth |
|-------|-----|-----|-----|-----|-----|
| 0 | E | E | E | E | V0 |
| 1 | E | E | E | P0 | V1 |
| 2 | E | E | P0 | P0 | V2 |
| ⋮ | | | | | |
| 15 | P2 | P2 | P2 | P2 | V15 |

Lookup Table

METHOD FOR ESTIMATING CHANNEL CHARACTERISTICS OF NONVOLATILE MEMORY DEVICE

CROSS-REFERENCES TO RELATED APPLICATION

The present application claims priority under 35 U.S.C. §119(a) to Korean application number 10-2012-0074470, filed on Jul. 9, 2012, in the Korean Intellectual Property Office, which is incorporated herein by reference in its entirety.

BACKGROUND

1. Technical Field

The present invention generally relates to a semiconductor memory device, and more particularly, to a method for estimating channel characteristics of a nonvolatile memory device.

2. Related Art

In general, a semiconductor memory device is classified into a volatile memory device and a nonvolatile memory device. The volatile memory device loses data stored therein when power supply is cut off, but the nonvolatile memory device maintains data stored therein even though power supply is cut off. The nonvolatile memory device may include various types of memory cells.

The nonvolatile memory device may be divided into a flash memory device, a ferroelectric RAM (FRAM) using a ferroelectric capacitor, a magnetic RAM (MRAM) using a tunneling magneto-resistive (TMR) layer, a phase change memory device using chalcogenide alloys and the like, depending on the structure of memory cells.

Among the nonvolatile memory devices, the flash memory device is roughly divided into a NOR flash memory device and a NAND flash memory device, depending on the connection state between memory cells and a bit line. The NOR flash memory device has a structure in which two or more memory cell transistors are connected in parallel to one bit line. Therefore, the NOR flash memory device has an excellent random access time characteristic. On the other hand, the NAND flash memory device has a structure in which two or more memory cell transistors are connected in series to one bit line. Such a structure is referred to as a cell string, and one bit line contact is required per one cell string. Therefore, the NAND flash memory device has an excellent characteristic in terms of integration degree.

In the nonvolatile memory devices, a multi-level cell (MLC) structure capable of storing two or more-bit data per one memory cell is widely used. The MLC has a disadvantage in operation speed and error rate, compared to a single-level cell (SLC) structure capable of storing one bit data per one memory cell. However, the use of the MLC structure has increased according to the trend of high capacity of the memory devices.

When n-bit data are to be stored in one memory cell, the memory cell must be programmed to have any one of $2^n$ threshold voltage distributions. As the size of data to be stored per memory cell increases, that is, n increases, the distance between the respective threshold voltage distributions may be reduced.

However, memory cells arranged in a two-dimensional structure at intersections between word lines and bit lines may be influenced by interference and noise while adjacent memory cells are programmed. Such an influence may change the threshold voltage distributions, and thus the memory cells have a wider threshold voltage distribution than the initial threshold voltage distribution. As a result, read fail rates of the memory cells may increase. Furthermore, due to a disturb phenomenon which may occur during a program operation or read operation, the read fail rates of the memory cells may increase.

As such, the memory cells of the nonvolatile memory device may influenced by various factors, and thus the threshold voltage distributions may be changed. Among the factors, the interference and noise between the memory cells may serve as a main factor to change the threshold voltage distributions. Therefore, when the characteristics of an interference channel and a noise channel are separately estimated, the estimation may be usefully used for designing a signal processing technique.

SUMMARY

A method for estimating channel characteristics of a nonvolatile memory device is described herein.

In an embodiment, a method for estimating channel characteristics of a nonvolatile memory device including a plurality of memory cells includes the steps of: calculating first threshold voltage distributions of the memory cells programmed according to input data, based on the input data and a physical structure of the memory cells; calculating second threshold voltage distributions of the memory cells, based on output data and the physical structure of the memory cells; and analyzing the relation between the first and second threshold voltage distributions, using a mask.

In an embodiment, a method for estimating channel characteristics of a nonvolatile memory device including a plurality of memory cells includes the steps of: calculating first threshold voltage distributions of the memory cells programmed according to input data, based on the input data and a physical structure of the memory cells; calculating second threshold voltage distributions of the memory cells based on output data and the physical structure of the memory cells; selecting a part of the memory cells using a mask, and analyzing an interference effect which adjacent memory cells among the selected memory cells have on a victim cell; and analyzing a noise effect which the adjacent memory cells have on the victim cell.

The method may further include the step of generating distributions of the interference effect and the noise effect, and generating a distribution chart of the channel characteristics by convoluting the generated interference effect distribution and the generated noise effect distribution.

BRIEF DESCRIPTION OF THE DRAWINGS

Features, aspects, and embodiments are described in conjunction with the attached drawings, in which.

DETAILED DESCRIPTION

Hereinafter, a method for estimating channel characteristics of a nonvolatile memory device according to various embodiments will be described below with reference to the accompanying drawings through the various embodiments.

Various embodiments will be described below in more detail with reference to the accompanying drawings. The present invention may, however, be embodied in different forms and should not be construed as limited to the embodiments set forth herein. Rather, various embodiments are provided so that this disclosure will be thorough and complete, and will fully convey the scope of the present invention to those skilled in the art.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

Figure 1:
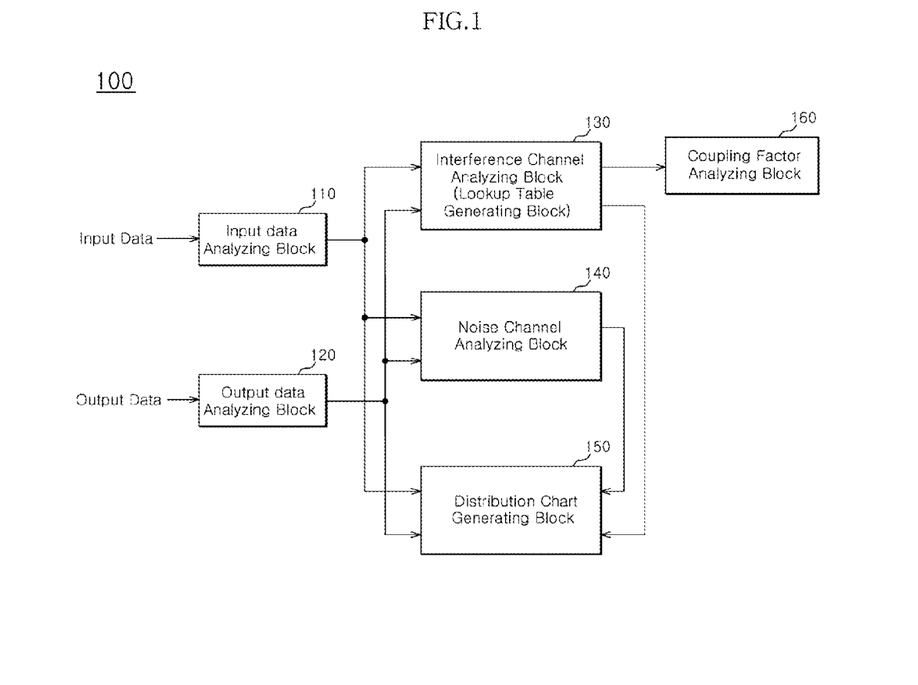
FIG. 1 is a block diagram of a software module for executing a method for estimating characteristics of interference and noise channels using input/output data of a nonvolatile memory device according to an embodiment.

FIG. 1 is a block diagram of a software module for executing a method for estimating characteristics of interference and noise channels using input/output data of a nonvolatile memory device according to an embodiment. Referring to FIG. 1, the software module 100, for estimating channel characteristics of the nonvolatile memory device, may include an input data analyzing block 110, an output data analyzing block 120, an interference channel analyzing block (Lookup Table Generating Block) 130, a noise channel analyzing block 140, a distribution chart generating block 150, and a coupling factor analyzing block 160.

Each input data analyzing block 110, output data analyzing block 120, interference channel analyzing block 130, noise channel analyzing block 140, distribution chart generating block 150, and coupling factor analyzing block 160 may be implemented in hardware with a digital circuit, an analog circuit, or a combination of digital and analog circuits. Additionally, each input data analyzing block 110, output data analyzing block 120, interference channel analyzing block 130, noise channel analyzing block 140, distribution chart generating block 150, and coupling factor analyzing block 160 may be implemented with a combination of hardware and software.

The input data analyzing block 110 may be configured to process and arrange input data. Here, the input data may include data which is actually programmed in the nonvolatile memory device. As the amount of input data increases, the channel characteristic estimation may be performed more precisely. The input data analyzing block 110 may provide the processed and arranged data to the interference channel analyzing block 130, the noise channel analyzing block 140, and the distribution chart generating block 150. The data processing and arranging operation of the input data analyzing block 110 will be described with reference to FIGS. 2 and 3.

Figure 2:
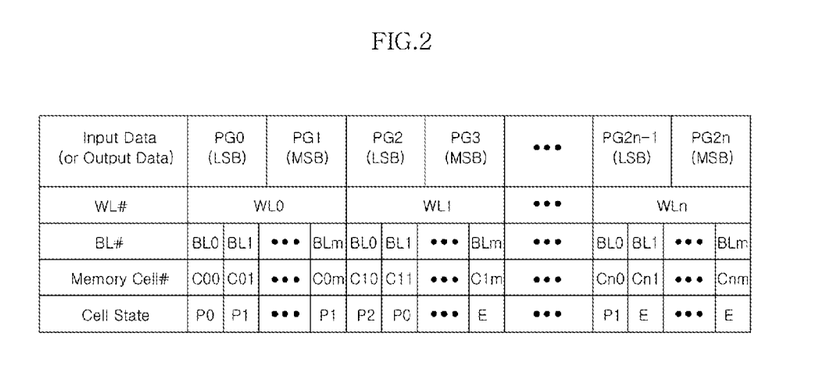
FIG. 2 is a table for explaining the operation of an input data analyzing block according to an embodiment.
Figure 3:
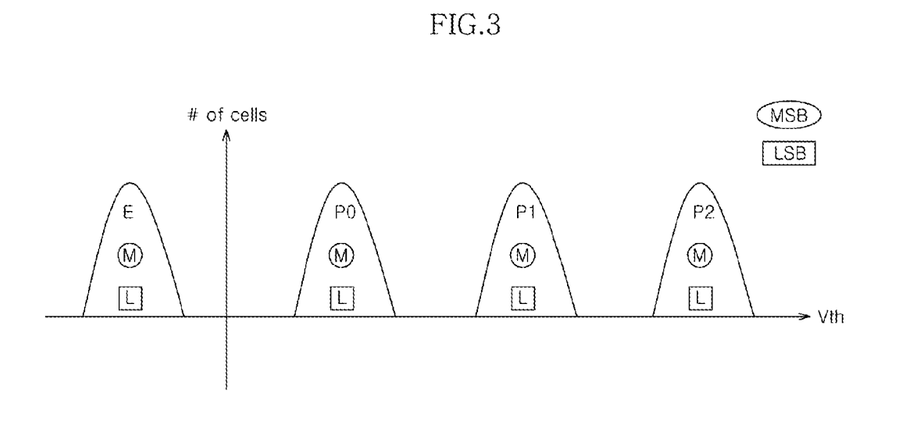
FIG. 3 is a diagram illustrating threshold voltage distributions of memory cells according to an embodiment.

FIG. 2 is a table for explaining the operation of the input data analyzing block according to an embodiment. FIG. 3 is a diagram illustrating threshold voltage distributions of memory cells according to an embodiment. For example, in FIGS. 2 and 3, it is assumed that the memory cells are MLCs for storing two bit data. In an embodiment, the MLC may store two bit data including lower page (hereafter, referred to as LSB page) (i.e., PG0 (LSB), PG2 (LSB), . . . PG2$n$−1 (LSB)) data and upper page (hereafter, referred to as MSB page) (i.e., PG1 (MSB), PG3 (MSB) . . . PG2$n$ (MSB)) data.

The memory cells of the nonvolatile memory device are two-dimensionally arranged at intersections between word lines (i.e., WL#) and bit lines (i.e., BL#). The memory cells may be grouped in a page-wise manner corresponding to the unit of program operation. Furthermore, the memory cells may be grouped in a block-wise manner corresponding to the unit of erase operation. A memory block may include a plurality of pages. A page address of the nonvolatile memory device is scrambled to prevent a program disturb phenomenon. That is, data which are sequentially inputted to the nonvolatile memory device are not programmed in a logical order, but programmed in a program order of the pages.

The input data analyzing block 110 may be configured to rearrange data inputted in a logical order of pages into data to be actually programmed into memory cells. Additionally, the input data analyzing block 110 may refer to addresses decided according to the physical structure of the memory cells (see Memory Cell#) (i.e., C00, C01 . . . C0$m$, C10, C11 . . . C1$m$ . . . C$n$0, C$n$1 . . . C$nm$), for example, paired page addresses (see Input Data (or Output Data)) (i.e., PG0 (LSB) paired to PG1 (MSB), PG2 (LSB) paired to PG3 (MSB) . . . PG2$n$−1 (LSB) paired to PG2$n$ (MSB)) related to a word line (see WL#) (i.e., WL0, WL1 . . . WL$n$) and column addresses (see BL#) (BL0, BL1 . . . BL$m$, and BL0, BL1 . . . BL$m$, and BL0, BL1 . . . BL$m$) related to a bit line (i.e., BL#).

For example, the input data analyzing block 110 rearranges data to be actually programmed into a memory cell C00, by referring to the paired page addresses (LSB page address PG0 and MSB page address PG1) related to a word line WL0 of the memory cell C00, a column address BL0, and data corresponding thereto. That is, the input data analyzing block 110 may calculate the threshold voltage (see FIG. 3, Vth of the x-axis) distribution of the memory cell C00 (see FIG. 3, # of cells of the y-axis), that is, a program state P0 (see Cell State) (i.e., P0, P1 . . . P1, P2, P0 . . . E . . . P1, E . . . E) (see also, FIG. 3E, P0, P1, P2) according to the data to be actually programmed into the memory cell C00 (i.e., see also FIG. 3 MSB corresponding to M and LSB corresponding to L). The input data analyzing block 110 may calculate the threshold voltage distributions of other memory cells C01 to C$nm$ according to data to be actually programmed into the corresponding memory cells, in the same manner as the memory cell C00.

FIG. 2 illustrates that input data are inputted in a page-wise manner, for convenience of description. However, although data having a size smaller or larger than one page is inputted, the input data analyzing block 110 may process and analyze the input data.

Referring to FIG. 1, the output data analyzing block 120 may be configured to process and arrange output data. Here, the output data is read from the nonvolatile memory device, and corresponds to the input data. As the amount of output data corresponding to input data increases, the channel characteristic estimation may be estimated more precisely. For example, the input data and the output data corresponding to the input data may have an amount to be programmed into one or more memory blocks.

The output data analyzing block 120 may provide the processed and arranged data to the interference channel analyzing block 130, the noise channel analyzing block 140, and the distribution chart generating block 150.

The input data is programmed into a memory cell through a program operation of the nonvolatile memory device. The output data corresponds to data read from a memory cell into which the is input data is programmed through the program operation. Therefore, when the data read through the output data analyzing block 120 is processed and arranged, the data read from the memory cell, that is, the threshold voltage distribution of the memory cell influenced by interference and noise is calculated.

The data processing and arranging operation of the output data analyzing block 120 may be performed in the same manner as the data processing and arranging operation of the input data analyzing block 110, which has been described with reference to FIGS. 2 and 3.

The interference channel analyzing block 130 may be configured to analyze characteristics of an interference channel based on the data processed through the input data analyzing block 110 and the output data analyzing block 120. The interference channel analyzing block 130 constructs a lookup table based on a set mask during the analyzing operation. The interference channel analyzing block 130 may estimate an effect which interfering memory cells have on a selected memory cell, based on the lookup table.

The setting of the mask used to construct the lookup table is one of important factors which are considered when estimating an interference channel. The setting of the mask and the lookup table constructed through an average method or RAM training method according to the mask will be described with reference to FIGS. 4 and 5.

Figure 4:
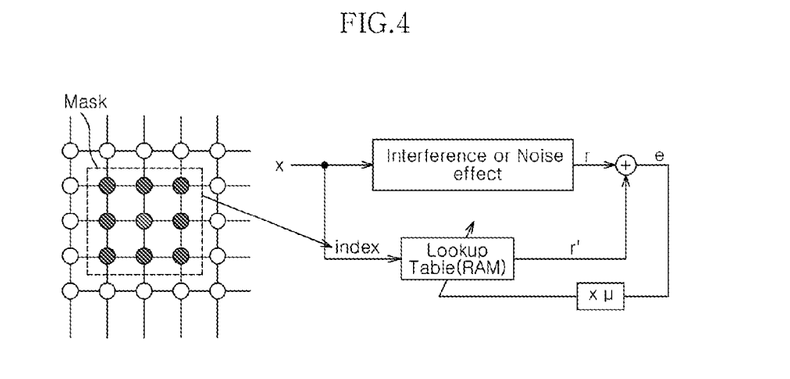
FIG. 4 is a diagram for explaining a lookup table generated during a process of estimating an interference channel according to an embodiment.
Figure 5:
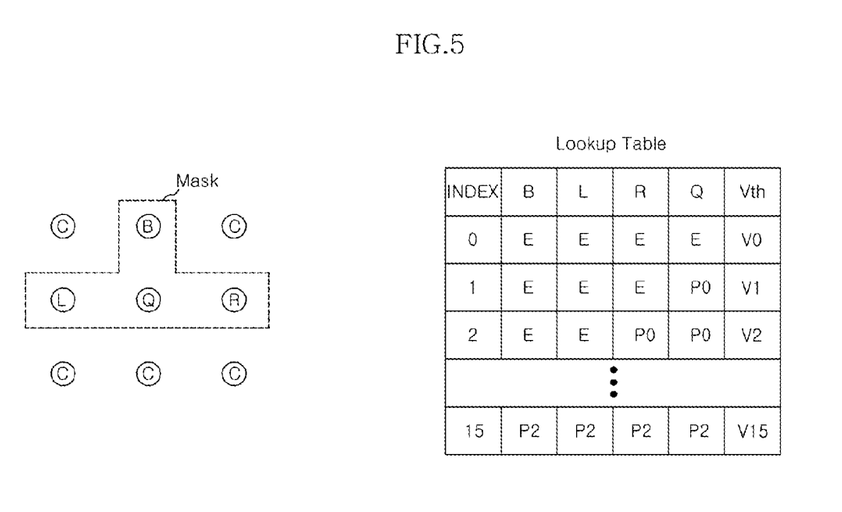
FIG. 5 is a block diagram schematically illustrating the process of estimating an interference channel according to an embodiment.

FIG. 4 is a diagram for explaining the lookup table generated during the process of estimating an interference channel according to an embodiment. FIG. 5 is a block diagram schematically illustrating the process of estimating an interference channel according to an embodiment.

When data of one memory block including MLCs are analyzed, it is effective to construct a mask (See FIGS. 4 and 5, i.e., Mask) using minimum five memory cells and maximum nine memory cells (i.e., C, B, C, L, Q, R, C, C, and C). For convenience of description, FIG. 4 illustrates a mask including four memory cells (i.e., see FIG. 5, i.e., B, L, Q, R). In FIG. 4, suppose that a memory cell Q is a victim cell disturbed by interference cells B, L, and R.

The lookup table (i.e., Lookup Table (RAM) of FIG. 4 and Lookup Table of FIG. 5) may be generated by an average method, that is, an arithmetic average method for output values Vth of the victim cell Q or the RAM training method, using the set mask. For example, the lookup table is constructed by calculating the number of cases based on states which the victim cell Q (See FIG. 5, i.e., E, P0, P0 ... P2) and the interference cells B (i.e., E, E, E ... P2), L (i.e., E, E, to E ... P2), and R (i.e., E, E, P0 ... P2) may have, that is, threshold voltage distributions (i.e., V0, V1, V2 ... V15). Furthermore, the lookup table may include threshold voltage values Vth of the victim cell Q, corresponding to the respective cases, and an index is decided according to the number of cells Q, B, L, and R within the set mask is and the number of states which the cells may have. The index may be used as an address of RAM (i.e., INDEX, 0, 1, 2 ... 15).

When the lookup table is constructed through the RAM training method, RAM contents may be updated by Equation 1 used in a RAM-DFE (Decision Feedback Equalizer), based on an LMS (Least Mean Square) algorithm which is one of adaptive filter methods.

$$RAM_{k+1}(address) = RAM_k(address) + \mu e_k \quad \text{[Equation 1]}$$

A (k+1)-th RAM value at a specific address is updated by multiplying (i.e., x) an error e between an actual output value r and an estimated value r' by a weight μ and adding (i.e., +) a k-th RAM value to the multiplication result. The weight μ has a value of 0<μ<1, and serves to control the update speed of the RAM value and reduce the error e (refer to FIGS. 4 and 5).

When the lookup table is constructed by the arithmetic average method, Equation 2 (see below) may be used.

$$\frac{1}{n}\sum_{k=1}^{n} r_k \quad \text{[Equation 2]}$$

In Equation 2, $r_k$ represents an output value corresponding to a specific mask pattern, that is, an output value of a group having the same pattern (for example, a pattern which is decided according to the states of the victim cell Q and the interference cells B, L, and R) in one memory block.

When the arithmetic average method or RAM training method is performed, the input data and the output data of the victim cell Q must correspond to each other within data provided from the input data analyzing block 110 and the output data analyzing block 120.

When a lookup table is constructed by applying the arithmetic average method or RAM training method to information on the provided input and output data, the lookup table has threshold voltage values of the victim cell Q influenced by interference of the adjacent cells B, L, and R within the set mask. That is, the lookup table may include input data and output data corresponding to the input data.

Referring to FIG. 1, the noise channel analyzing block 140 may be configured to analyze characteristics of a noise channel based on the data processed through the input data analyzing block 110 and the output data analyzing block 120. The analyzing of the noise channel through the noise channel analyzing block 140 will be performed through the following process.

The output data (that is, the threshold voltage distributions of the respective memory cells) are grouped for all possible combinations of patterns P according to the threshold voltage levels of the memory cells within the set mask. For example, the pattern is groups may be set in such a manner as described in the lookup table of FIG. 4. When the pattern P may include n memory cells, the number of groups may correspond to L^n. Here, L represents the number of threshold voltage levels of a memory cell (for example, L=2 in the case of the SLC, and L=4 in the case of the MLC).

When the average value of data for each group is calculated and data within all of the groups are mean-shifted by the average value, the data within the groups form a distribution having a specific dispersion based on a spot where the average is zero (that is, zero-mean). Such a distribution may correspond to a distribution for the noise channel. The noise distribution data may be represented as a distribution chart by the distribution chart generating block 150.

All possible combinations of patterns within the mask are equally shifted by the average value, and sub patterns within the mask are set. Here, the sub pattern indicates a pattern P' (including cells adjacent to the victim cell) for estimating channel characteristics. For example, when noise distribution characteristics based on the levels of the victim cell and a memory cell adjacent to the bottom of the victim cell are to be analyzed, the sub pattern P' may include the victim cell and the memory cell adjacent to the bottom of the victim cell. When the set sub pattern P' may include m memory cells, the number of possible combinations of cell levels may correspond to $L^m$. Since the pattern P' is a sub pattern of the pattern P, a plurality of patterns including a pattern which may be set to the sub pattern P' may exist. Therefore, when the $L^n$ groups are reclassified according to $L^m$ combinations and all output data having the sub pattern P' are collected, it is possible to obtain $L^n$ noise distribution data based on the change of the sub pattern P'.

Figure 6:
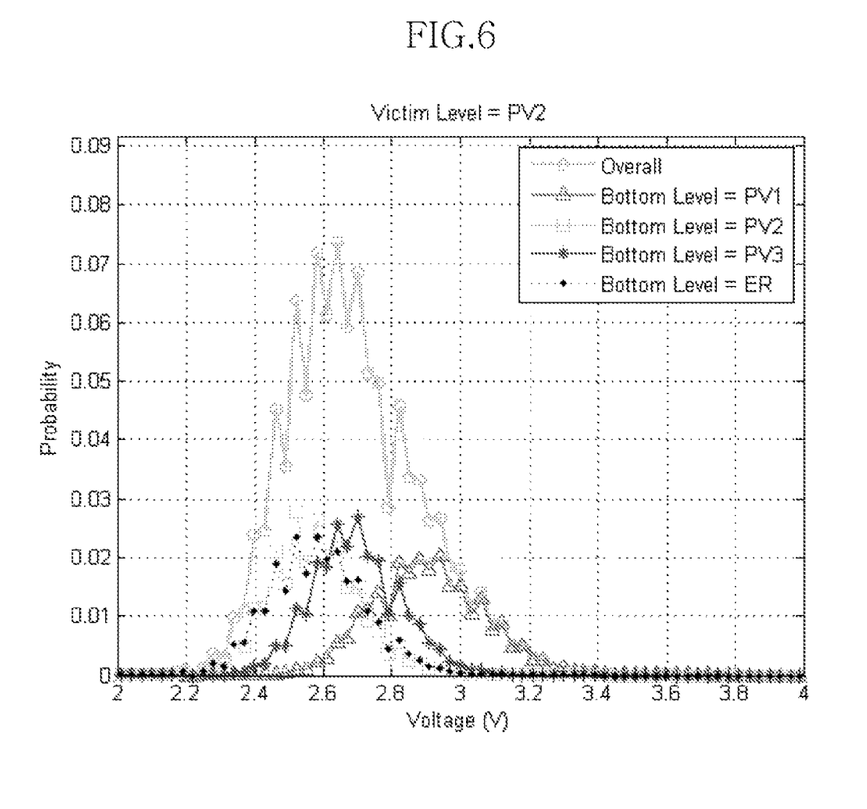
FIG. 6 is a diagram illustrating actual output distributions of memory cells, generated by a distribution chart generating block according to an embodiment.
Figure 7:
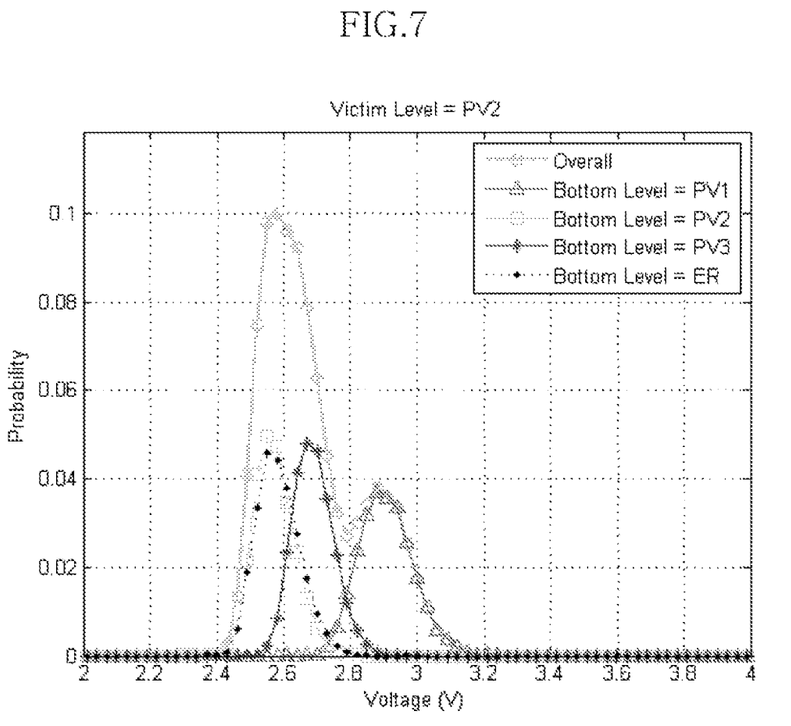
FIG. 7 is a diagram illustrating distributions of interference signals caused by adjacent memory cells, generated by the distribution chart generating block according to an embodiment.
Figure 8:
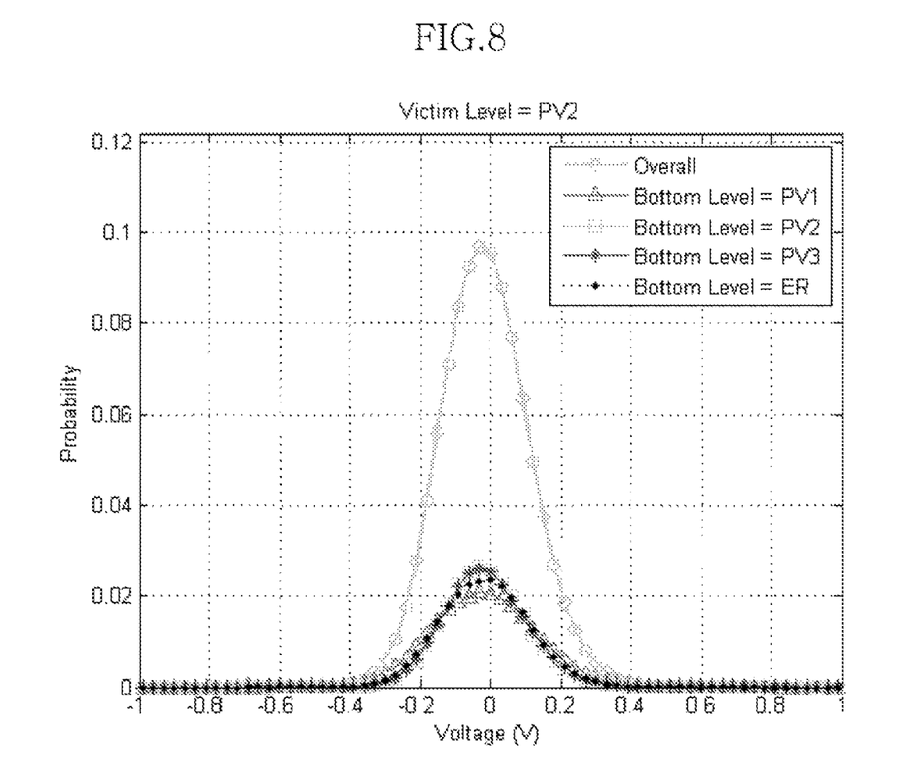
FIG. 8 is a diagram illustrating distributions of noise signals, generated by the distribution chart generating block according to an embodiment.

The distribution chart generating block 150 may be configured to generate a distribution chart based on the input and output data and channel analysis data. For example, the distribution chart generating block 150 may be configured to generate a distribution chart based on the data processed by the input data analyzing block 110 and the output data analyzing block 120. Such a distribution chart is illustrated in FIG. 6. For example, FIG. 6 illustrates Probability on the y-axis and Voltage (V) on the x-axis. FIG. 6 also illustrates, for example, an overall line, and bottom level lines equal to PV1, PV2, PV3, and ER (i.e., Bottom Level=PV1, Bottom Level=PV2, Bottom Level=PV3, Bottom Level=ER) for when the Victim Level is equal to PV2 (i.e., Victim Level=PV2). Furthermore, the distribution chart generating block 150 may be configured to generate a distribution chart based on the channel analysis data provided from the interference channel analyzing block 130. Such a distribution chart is illustrated in FIG. 7. For example, FIG. 7 illustrates Probability on the y-axis and Voltage (V) on the x-axis. FIG. 7 also illustrates, for example, an overall line, and bottom level lines equal to PV1, PV2, PV3, and ER (i.e., Bottom Level=PV1, Bottom Level=PV2, Bottom Level=PV3, Bottom Level=ER) for when the Victim Level is equal to PV2 (i.e., Victim Level=PV2). Furthermore, the distribution chart generating block 150 may be configured to generate a distribution chart based on the channel analysis data provided from the noise channel analyzing block 140. Such a distribution chart is illustrated in FIG. 8. For example, FIG. 8 illustrates Probability on the y-axis and Voltage (V) on the x-axis. FIG. 8 also illustrates, for example, an overall line, and bottom level lines equal to PV1, PV2, PV3, and ER (i.e., Bottom Level=PV1, Bottom Level=PV2, Bottom Level=PV3, Bottom Level=ER) for when the Victim Level is equal to PV2 (i.e., Victim Level=PV2).

Figure 9:
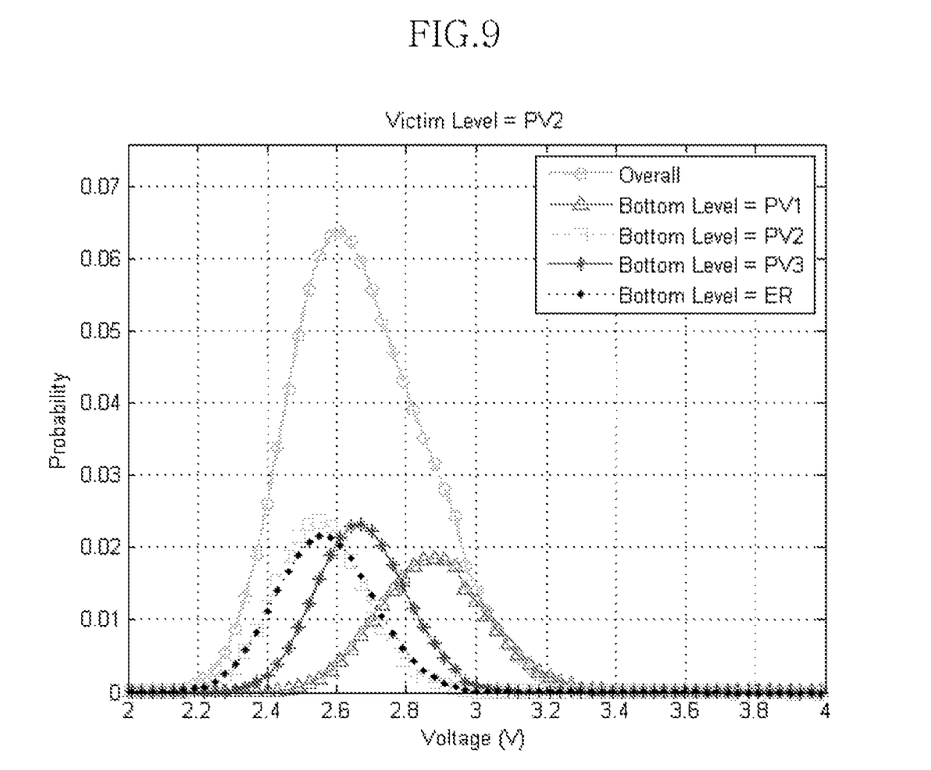
FIG. 9 is a diagram illustrating the entire channel characteristic distributions generated by the distribution chart generating block according to an embodiment.

Additionally, the distribution chart generating block 150 may be configured to generate a distribution chart showing the entire channel characteristics of memory cells by convoluting a distribution of interference signals and a distribution of noise signals. Such a distribution chart is illustrated in FIG. 9. For example, FIG. 9 illustrates Probability on the y-axis and Voltage (V) on the x-axis. FIG. 9 also illustrates, for example, an overall line, and bottom level lines equal to PV1, PV2, PV3, and ER (i.e., Bottom Level=PV1, Bottom Level=PV2, Bottom Level=PV3, Bottom Level=ER) for when the Victim Level is equal to PV2 (i.e., Victim Level=PV2). The distribution chart generated through the convolution may be used to examine the validity of the analyzed interference signal distribution. Furthermore, the distribution chart generated through the convolution may be used to average and examine the entire channel characteristics.

The coupling factor analyzing block 160 may be configured to analyze a coupling effect which the adjacent cells have on the victim cell, using the analysis data generated by the interference channel analyzing block 130. The mask pattern used for analyzing a coupling factor is constructed by selecting a victim cell, a memory cell A (see Equations 3 and 4 below) of which the coupling factor is to be analyzed, and arbitrary memory cells remote from the victim cell, that is, arbitrary memory cell which are not adjacent to the victim cell. The averaged data obtained through the interference channel analyzing block 130 and a dispersion value based on the averaged data are used to calculate the coupling factor using such a mask pattern. The coupling factor is calculated by Equations 3 and 4 (see below). The coupling factor may be calculated by dividing the dispersion value obtained through the interference channel analyzing block 130 by dispersion (or standard deviation) for threshold voltage variations during a program process.

$$\sigma^2_{f(\upsilon,A)} = c^2(A,\upsilon)\sigma^2_{S_A} \qquad \text{[Equation 3]}$$

$$c(A,\upsilon) = \sigma_{r(\upsilon,A)}/\sigma_{S_A} \qquad \text{[Equation 4]}$$

In Equations 3 and 4, $c(A, \upsilon)$ represents a coupling factor between the memory cell A and the victim cell for a specific input level. In $\sigma^2_{S_A} = E[\{S_A - \overline{S}_A\}^2]$ which is the dispersion for the threshold voltage increase, $S_A$ represents a threshold voltage increase during the program process for the memory cell A. Suppose that interference applied to the victim cell during the program process of the adjacent cells linearly depends on $S_A$.

According to an embodiment, the input data of the nonvolatile memory device, which is to be analyzed, is rearranged by considering the physical structure of the nonvolatile memory device. Furthermore, the mask including the victim cell and the adjacent cells are set based on the rearranged data. The output data are grouped through the set mask, and the arithmetic average method or RAM training method is used to construct the lookup table. When the output distributions of the victim cell are constructed based on the lookup table, it is possible to analyze the interference caused by the adjacent cells. Furthermore, when the mask is changed in various manners to perform an algorithm, it is possible to individually estimate the dispersion caused by the interference of the adjacent cells. Additionally, the noise may be analyzed by shifting the output data by the average value. The interference distribution information and the noise distribution information may be used in a memory controller during the read and program operations.

While various embodiments have been described above, it will be understood to those skilled in the art that the embodiments described are by way of example only. Accordingly, the method described herein should not be limited based on the described embodiments.

What is claimed is:
1. A method for estimating channel characteristics of a nonvolatile memory device including a plurality of memory cells, comprising the steps of:
calculating first threshold voltage distributions of the memory cells programmed according to input data, based on the input data and a physical structure of the memory cells;

calculating second threshold voltage distributions of the memory cells, based on output data and the physical structure of the memory cells; and analyzing the relation between the first and second threshold voltage distributions, using a mask.

2. The method according to claim 1, wherein the step of analyzing the relation comprises the step of analyzing an interference channel on a victim cell among memory cells included in the mask.

3. The method according to claim 2, wherein the step of analyzing the interference channel comprises the step of constructing a lookup table based on the first and second threshold voltage distributions of the memory cells included in the mask.

4. The method according to claim 3, wherein the lookup table is generated by an arithmetic average method or RAM training method.

5. The method according to claim 3, further comprising the step of estimating an effect that interfering memory cells have on a selected memory cell based on the lookup table.

6. The method according to claim 1, wherein the step of analyzing the relation comprises the step of analyzing a noise channel on a victim cell among memory cells included in the mask.

7. The method according to claim 6, wherein the step of analyzing the noise channel comprises the steps of:
grouping the output data for all possible combinations of patterns according to the levels of the memory cells included in the mask, and generating a plurality of groups; and
shifting the data of the groups by an average value.

8. The method according to claim 1, wherein the step of analyzing the relation comprises the step of analyzing a coupling effect which memory cells adjacent to a victim cell have on the victim cell.

9. The method according to claim 1, further comprising the step of generating a distribution chart for the first threshold voltage distributions, the second threshold voltage distributions, or the analysis result generated through the step of analyzing the relation.

10. The method according to claim 1, wherein the input data and the output data corresponding to the input data comprise data for the memory cells included in one or more memory blocks.

11. The method according to claim 1, wherein the memory cells comprise of multiple level cells configured for storing lower page data and upper page data.

12. A method for estimating channel characteristics of a nonvolatile memory device including a plurality of memory cells, comprising the steps of:

calculating first threshold voltage distributions of the memory cells programmed according to input data, based on the input data and a physical structure of the memory cells;

calculating second threshold voltage distributions of the memory cells based on output data and the physical structure of the memory cells;

selecting a part of the memory cells using a mask, and analyzing an interference effect which adjacent memory cells among the selected memory cells have on a victim cell; and analyzing a noise effect which the adjacent memory cells have on the victim cell.

13. The method according to claim 12, further comprising the step of constructing the mask using a minimum of five memory cells and a maximum of nine memory cells.

14. The method according to claim 12, further comprising the step of generating distributions of the interference effect and the noise effect, and generating a distribution chart of the channel characteristics by convoluting the generated interference effect distribution and the generated noise effect distribution.

15. The method according to claim 12, wherein the step of analyzing the interference effect comprises the step of constructing a lookup table based on the first and second threshold voltage distributions of memory cells included in the mask.

16. The method according to claim 15, wherein the lookup table is generated using an arithmetic average method or RAM training method.

17. The method according to claim 12, further comprising the step of estimating an effect that interfering memory cells have on a selected memory cell based on the lookup table.

18. The method according to claim 12, wherein the step of analyzing the noise effect comprises the steps of:
grouping the output data for all possible combinations of patterns according to the levels of the memory cells included in the mask, and generating a plurality of groups; and
shifting the data of the groups by an average value.

19. The method according to claim 12, further comprising the step of analyzing a coupling effect which the adjacent memory cells have on the victim cell.

20. The method according to claim 12, wherein the memory cells comprise of multiple level cells configured for storing lower page data and upper page data.

* * * * *